(12) United States Patent
Kwon

(10) Patent No.: US 7,892,877 B2
(45) Date of Patent: Feb. 22, 2011

(54) METHOD OF MANUFACTURING IMAGE SENSOR

(75) Inventor: Doo-won Kwon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 720 days.

(21) Appl. No.: 11/878,829

(22) Filed: Jul. 27, 2007

(65) Prior Publication Data

US 2008/0038865 A1    Feb. 14, 2008

(30) Foreign Application Priority Data

Aug. 8, 2006    (KR) .................. 10-2006-0074835

(51) Int. Cl.
*H01L 21/00* (2006.01)
(52) U.S. Cl. .................. 438/73; 257/292; 438/57; 438/75
(58) Field of Classification Search ........ 438/73, 438/57, 75; 257/292
See application file for complete search history.

(56) References Cited

U.S. PATENT DOCUMENTS

| | | | |
|---|---|---|---|
| 6,194,258 B1 * | 2/2001 | Wuu | 438/200 |
| 6,835,590 B2 * | 12/2004 | Lee | 438/69 |
| 2006/0084195 A1 * | 4/2006 | Lyu | 438/48 |
| 2007/0117254 A1 * | 5/2007 | Pain | 438/75 |
| 2007/0204959 A1 * | 9/2007 | Nakanishi et al. | 156/345.36 |

FOREIGN PATENT DOCUMENTS

| | | |
|---|---|---|
| JP | 1-245528 | 9/1989 |
| JP | 2001-230402 | 8/2001 |
| JP | 2002-231915 | 8/2002 |
| KR | 2001-0061489 | 7/2001 |
| KR | 10-2002-0045867 A | 6/2002 |
| KR | 2003-0040865 | 5/2003 |
| KR | 10-2006-0104881 | 10/2006 |

OTHER PUBLICATIONS

Korean Notice of Allowance dated Oct. 16, 2007.
Korean Notice of Examination Report dated Jun. 20, 2007 for corresponding Korean Patent Application No. 10-2006-0074835.

* cited by examiner

*Primary Examiner*—N Drew Richards
*Assistant Examiner*—Yu-Hsi Sun
(74) *Attorney, Agent, or Firm*—Harness, Dickey & Pierce

(57) ABSTRACT

Provided is a method of manufacturing an image sensor which may include forming a plurality of photoelectric converters on a semiconductor substrate, forming a silicon nitride (SiN) film on the plurality of photoelectric converters, supplying plasma gas including hydrogen to the SiN film, and performing a heat treatment on the semiconductor substrate.

22 Claims, 10 Drawing Sheets

METHOD OF MANUFACTURING IMAGE SENSOR

A claim of priority is made to Korean Patent Application No. 10-2006-0074835 filed on Aug. 8, 2006, in the Korean Intellectual Property Office, the disclosure of which is incorporated herein by reference in its entirety.

BACKGROUND

1. Field

Example embodiments of the present invention may relate to a method of manufacturing an image sensor.

2. Description of the Related Art

An image sensor may be used to convert an optical image into electric signals. In recent years, with the development of the communication and computer industries there has been an increasing demand for high-performance image sensors used in various devices, for example, digital cameras, camcorders, personal communication systems, game devices, security cameras, medical micro-cameras, robots, etc.

To manufacture an image sensor, an etching process and an ion implanting process may be repeatedly performed to create a photoelectric converter of the image sensor. However, during these processes silicon and oxygen bonding on a surface of a semiconductor substrate may be damaged, resulting in dangling bonds, for example, (—Si—O—) or (—Si—). The dangling bonds may cause a large amount of dark current to flow from the photoelectric converter to a charge transmitter, which may lower the reliability of the image sensor.

Diffusing hydrogen into a semiconductor substrate may be used to reduce the dangling bonds. In this case, an insulating film may be deposited by plasma enhanced chemical vapor deposition (PECVD) method, and a heat treatment may be performed to diffuse hydrogen into the semiconductor substrate. Since the insulating film formed by the PECVD method may have a high hydrogen content, the insulating film may be suitable for supplying hydrogen to the semiconductor substrate. However, when the insulating film is formed by the PECVD method, it may be difficult to reduce the thickness of the insulating film below a certain thickness.

Therefore, a low pressure chemical vapor deposition (LPCVD) method may be used to form an insulating film having a relatively small thickness. However, since the insulating film formed by the LPCVD method has a low hydrogen content, it may be difficult to diffuse hydrogen into the semiconductor substrate.

SUMMARY

In an example embodiment, a method of manufacturing an image sensor may include forming a plurality of photoelectric converters on a semiconductor substrate, forming a silicon nitride (SiN) film on the plurality of photoelectric converters, supplying plasma gas including hydrogen to the SiN film, and performing a heat treatment on the semiconductor substrate.

In another example embodiment, a method of manufacturing an image sensor may include forming a plurality of photoelectric converters on a semiconductor substrate, forming a silicon nitride (SiN) film on the plurality of photoelectric converters, bonding hydrogen to the SiN film, and diffusing the hydrogen of the SiN film into the plurality of photoelectric converters

BRIEF DESCRIPTION OF THE DRAWINGS

The above and other features of the example embodiments of the present invention may become more apparent with the description thereof with reference to the attached drawings in which.

DETAILED DESCRIPTION OF EXAMPLE EMBODIMENTS

Figure 1:
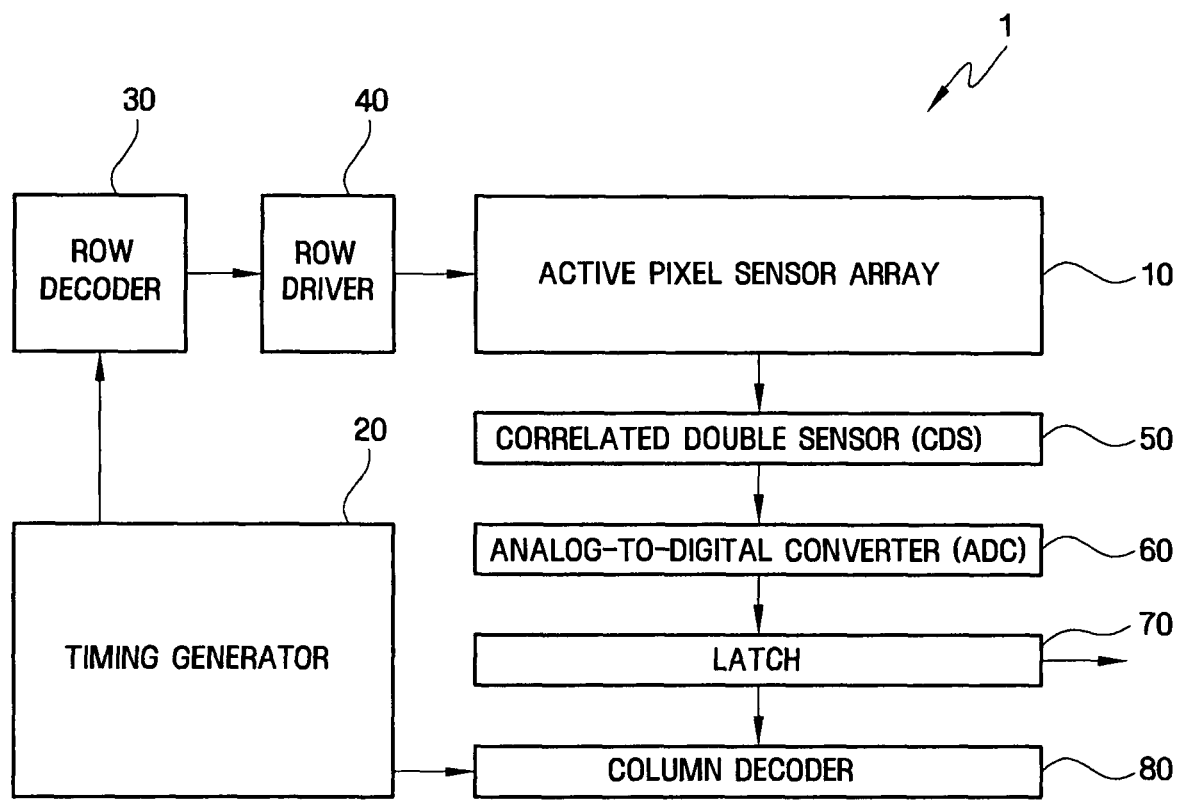
FIG. 1 is a block diagram illustrating an image sensor according to an example embodiment.

Features of the example embodiments and methods of accomplishing the same may be understood more readily by reference to the following detailed description and the accompanying drawings. The example embodiments may, however, be embodied in many different forms and should not be construed as being limited to the embodiments set forth herein. Rather, these example embodiments are provided so that this disclosure will be thorough and will convey the concept of the example embodiments to those skilled in the art. In the example embodiments of the present invention, a detailed description of known device structures and techniques incorporated herein will be omitted when it may make the subject matter of the example embodiments unclear. In the descriptions of the example embodiments, an n-type element and a p-type element are just illustrative examples, and example embodiments described and illustrated in the specification include complementary embodiments thereof.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Image sensors according to example embodiments may include charge coupled device (CCD) image sensors, as well as complementary metal oxide semiconductor (CMOS) image sensors. The CCD image sensor may have smaller noise and better image quality than the CMOS image sensor. However, the CCD image sensor may require a higher voltage and may be more expensive to manufacture than the CMOS image sensor. In addition, the CMOS image sensor may be easier to operate and may be implemented in various scanning methods. Moreover, since a signal processing circuit may be integrated with a CMOS image sensor on a single chip, smaller products may be produced. In addition, the manufacturing costs may be reduced using a CMOS manufacturing technology. Further, due to lower power consumption, the CMOS image sensor may be easily applied to products with limited battery capacity. In light of the foregoing, the example embodiments will be described with reference to the CMOS image sensor. However, the example embodiments may also be applied to the CCD image sensor as well.

Image sensors according to exemplary embodiments will now be described with reference to the accompanying drawings.

FIG. 1 is a block diagram illustrating an image sensor according to an example embodiment.

Referring to FIG. 1, an image sensor 1 according to the example embodiment may include an active pixel sensor (APS) array 10, a timing generator 20, a row decoder 30, a row driver 40, a correlated double sampler (CDS) 50, an analog-to-digital converter (ADC) 60, a latch 70, and a column decoder 80.

The APS array 10 may include a plurality of unit pixels 100 (see FIG. 3) two dimensionally arranged therein. The plurality of unit pixels 100 may convert an optical image into electrical signals. The APS array 10 may operate in response to a plurality of driving signals, for example, a pixel selection signal ROW, a reset signal RST, and a charge transmission signal TG received from the row driver 40. The APS array 10 may provide the converted electric signals to the CDS 50.

The timing generator 20 may provide a timing signal and a control signal to the row decoder 30 and the column decoder 80, respectively.

The row driver 40 may provide a plurality of driving signals to the APS array 10 to operate the plurality of unit pixels 100 according to the decoding result of the row decoder 30. In general, when the unit pixels 100 are arranged in a matrix, a driving signal may be provided for each row.

The CDS 50 may receive the electrical signal from the APS array 10 via a vertical signal line (discussed in detail below with respect to FIG. 2) and perform holding and sampling operations. For example, the CDS 50 may double sample a desired reference voltage level (hereinafter, referred to as a "noise level") and a voltage level of the electrical signal (hereinafter, referred to as a "signal level"), and the CDS 50 may output a differential level corresponding to the difference between the noise level and the signal level.

The ADC 60 may convert an analog signal corresponding to the differential level into a digital signal and then output the digital signal.

The latch 70 may latch the digital signal. The latched signal may be sequentially output to an image signal processor (not shown) according to the decoding result of the column decoder 80.

Figure 2:
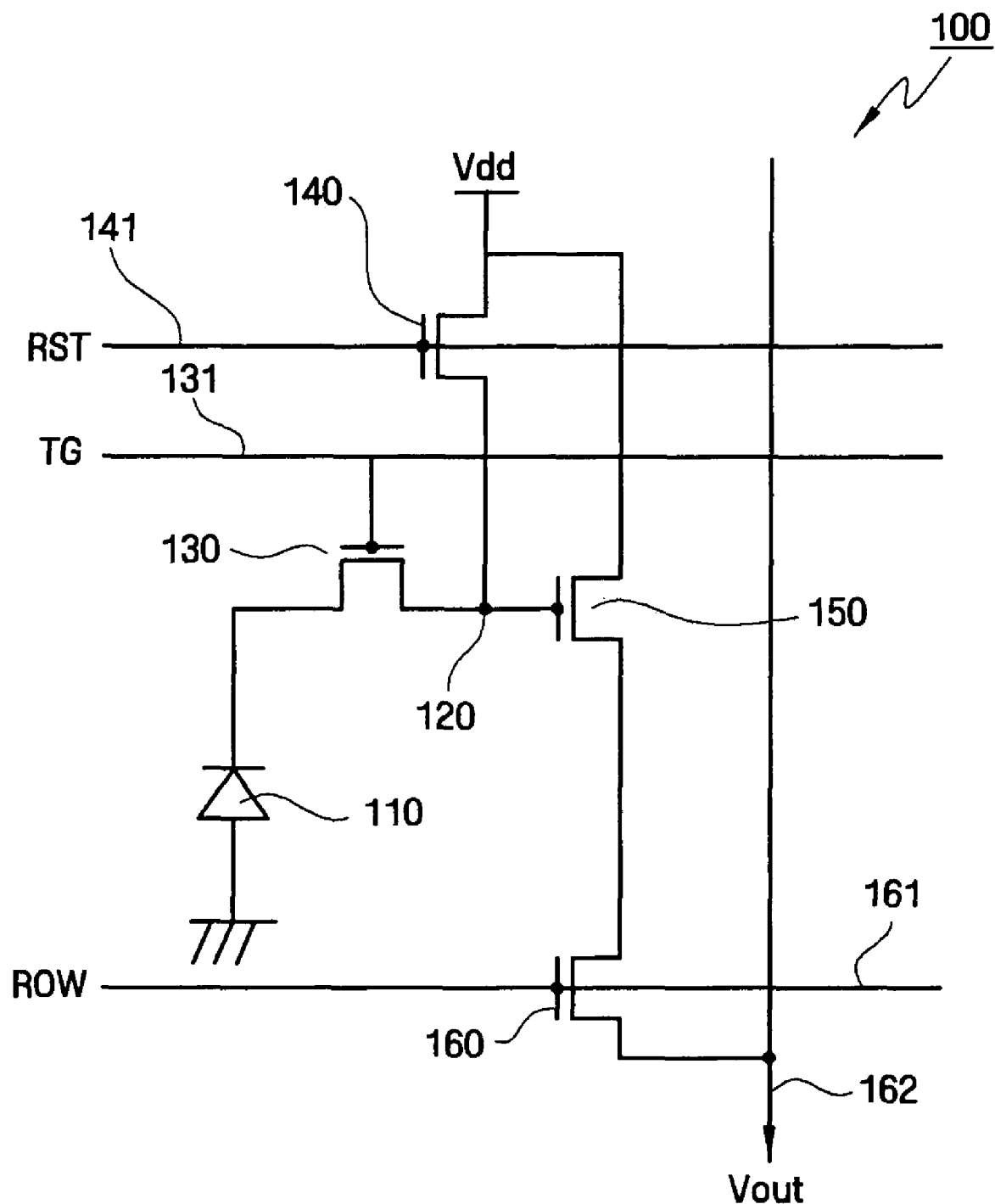
FIG. 2 is a circuit diagram illustrating a unit pixel of an image sensor according to an example embodiment.
Figure 3:
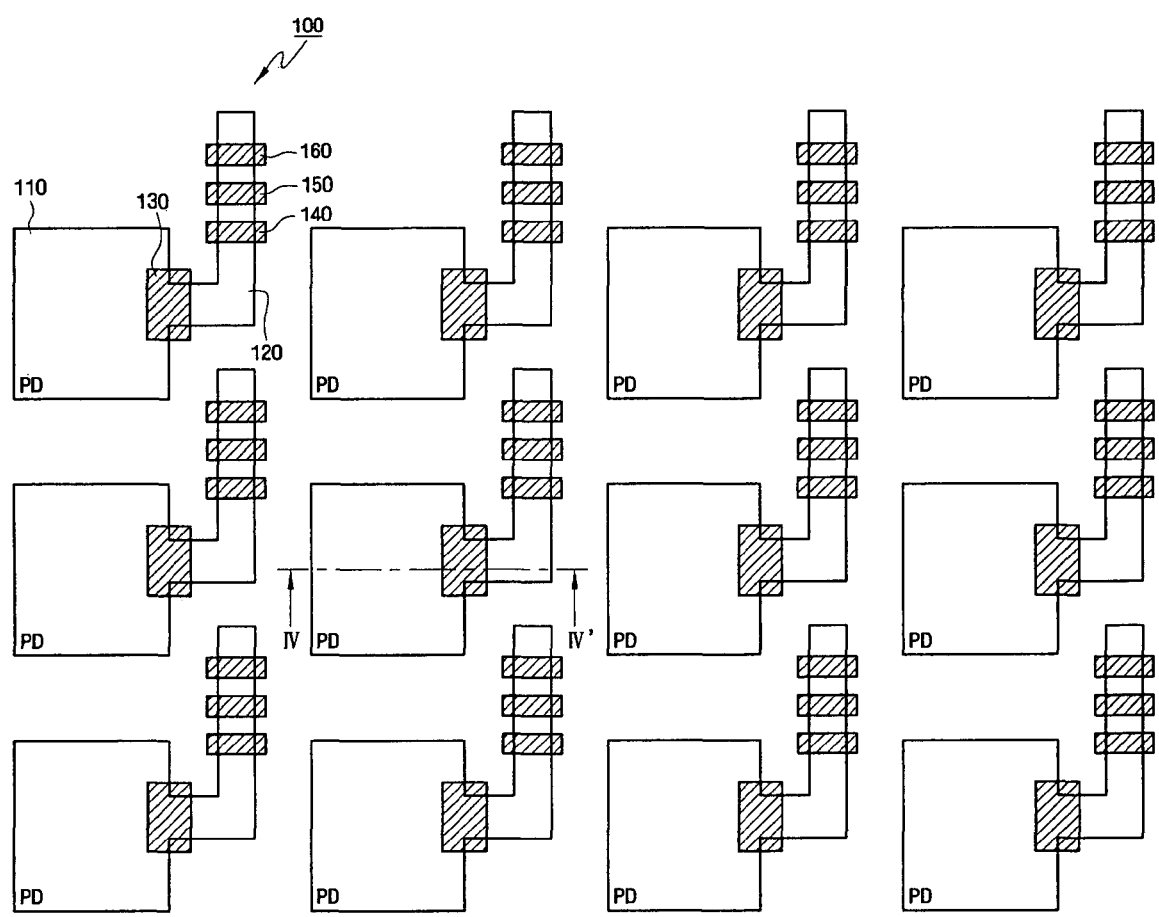
FIG. 3 is a plan view schematically illustrating an active pixel sensor array of an image sensor according to an example embodiment.

FIG. 2 is a circuit diagram of a unit pixel 100 of an image sensor 1 according to an example embodiment. FIG. 3 is a schematic plan view of an APS array 10 of the image sensor 1 according to an example embodiment.

Referring to FIGS. 2 and 3, the unit pixel 100 of the image sensor 1 according to an example embodiment may include a photoelectric converter 110, a charge detector 120, a charge transmitter 130, a reset unit 140, an amplifier 150, and a selector 160. In this example embodiment, the unit pixel 100 may include four transistors as shown in FIG. 2. However, the unit pixel 100 may include more or less than four transistors.

The photoelectric converter 110 may receive incident light and store electrical charges corresponding to the intensity of the incident light. The photoelectric converter 110 may be a photodiode, a phototransistor, a photogate, a pinned photodiode (PPD), etc. or a combination thereof.

The charge detector 120 may be implemented as a floating diffusion (FD) region and receive the electrical charges stored in the photoelectric converter 110. Since the charge detector 120 may have parasitic capacitance, the electrical charges may be cumulatively stored in the charge detector 120. The charge detector 120 may be electrically connected to a gate of the amplifier 150 to control the amplifier 150.

The charge transmitter 130 may transmit the electrical charges from the photoelectric converter 110 to the charge detector 120. In general, the charge transmitter 130 may include a transistor and may be controlled by a charge transmission signal TG.

The reset unit 140 may periodically reset the charge detector 120. A source of the reset unit 140 may be connected to the charge detector 120; and a drain of the reset unit 140 may be connected to a power supply voltage terminal Vdd. The reset unit 140 may operate in response to the reset signal RST.

The amplifier 150 in combination with a constant current source (not shown), which may be positioned external to the unit pixel 100, may function as a source follower buffer amplifier. A voltage varying in response to the voltage of the charge detector 120 may be output from the amplifier 150 to a vertical signal line 162. A source of the amplifier 150 may be connected to a drain of the selector 160 and a drain of the amplifier 150 may be connected to the power supply voltage terminal Vdd.

The selector 160 may select each row of the unit pixels 100 to be read. The selector 160 may operate in response to the pixel selection signal ROW, and a source of the selector 160 may be connected to the vertical signal line 162.

In addition, driving signal lines 131, 141, and 161 of the charge transmitter 130, the reset unit 140, and the selector 160, respectively, may extend in a row direction (horizontal direction in FIG. 2) such that the unit pixel 100 belonging to the same row may be simultaneously driven.

Figure 4:
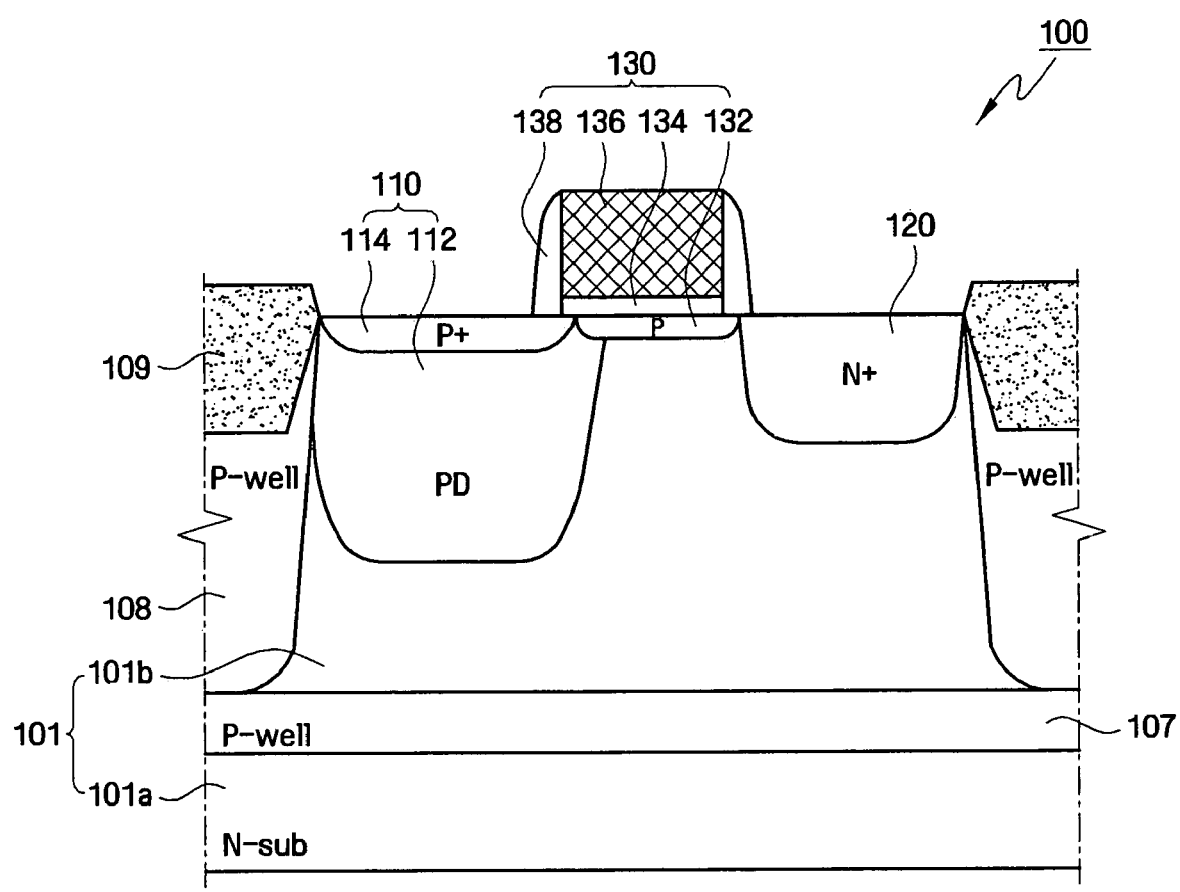
FIG. 4 is a cross-sectional view of a unit pixel of the image sensor according to the example embodiment taken along the line IV-IV' of FIG. 3.

FIG. 4 is a cross-sectional view of a unit pixel 100 of an image sensor 1 according to an example embodiment taken along the line IV-IV of FIG. 3.

Referring to FIG. 4, an image sensor 1 according to an example embodiment may include a semiconductor substrate 101, a deep well 107, an isolation well 108, an isolation region 109, the photoelectric converter 110, the charge detector 120, and the charge transmitter 130. In this example embodiment, a pinned photo diode (PPD) may be used as the photoelectric converter 110.

The semiconductor substrate 101 may be of a first conductivity type (for example, an N type) and may include a lower substrate area 101a and an upper substrate area 101b. In detail, the lower and upper substrate areas 101a and 101b may be defined by the deep well 107 of a second conductivity type (for example, a P type) formed at a desired depth in the semiconductor substrate 101. In this example embodiment, although the N-type semiconductor substrate 102 has been described, example embodiments are not limited thereto.

The deep well 107 may form a potential barrier so that electrical charges generated deep in the lower substrate area 101 may be prevented from flowing into the photoelectric converter 110 to facilitate a recombination between charges and holes. Consequently, the deep well 107 may reduce pixel-to-pixel crosstalk caused by random drift of charges.

For example, the deep well 107 may have the highest concentration of impurities at a depth of about 3 to 12 μm from the surface of the semiconductor substrate 101 and may have a thickness of about 1 to 5 μm. In this example embodiment, the depth of about 3 to 12 μm is substantially equal to the absorption length of red or near infrared region light of silicon. As the depth of the deep well 107 from the surface of the semiconductor substrate 101 becomes smaller, diffusion of electrical charges may be more effectively prevented, resulting in a decrease in crosstalk. However, because the region of photoelectric converter 110 also becomes thinner, sensitivity with respect to incident light having a long wavelength (for example, a red wavelength) that has a high photoelectric conversion rate at a deep region may also decrease. Accordingly, the location of the deep well 107 may be adjusted according to the wavelength range of incident light.

The isolation region 109 may be formed on the upper substrate area 101b to define an active region. Generally, the isolation region 109 may be a field oxide (FOX) or shallow trench isolation region formed by a LOCOS (local oxidation of silicon) method.

In addition, an isolation well 108 of the second conductivity type (for example, a P type) may be formed between the isolation region 109 and the upper substrate area 101b. The isolation well 108 may isolate a plurality of photodiodes 112 from each other. To reduce horizontal crosstalk among the photodiodes 112, the isolation well 108 may be formed at a depth greater than the depth of the photodiodes 112, and may be further formed to be connected to the deep well 107 as shown in FIG. 4.

The photoelectric converter 110 may be formed on the semiconductor substrate 101 and may include an N-type photodiode 112 and a P+-type pinning layer 114.

The photodiode 112 may store electrical charges generated corresponding to incident light. The pinning layer 114 may reduce electron-hole pairs (EHPs) thermally generated from the upper substrate area 101b, thereby reducing dark current.

The photodiode 112 may be formed so as to be separated from the deep well 107 by a desired distance. This permits using the upper substrate area 101b disposed under the photodiode 112 as a photoelectric conversion region. Therefore, color sensitivity may be improved with respect to a long wavelength (for example, a red wavelength) having deep penetration into silicon.

The photodiode 112 may have an impurity concentration of about $1\times10^{15}$ to $1\times10^{18}$ atoms/cm$^3$, and the pinning layer 114 may have an impurity concentration of about $1\times10^{17}$ to $1\times10^{20}$ atoms/cm$^3$. However, the concentration and position of doped impurity ions may depend on the manufacturing process and design, and thus the position of doped impurity ions are not limited to the above described.

The charge detector 120 may be formed in the semiconductor substrate 101 and receive the electrical charges stored in the photoelectric converter 110 through the charge transmitter 130. The charge transmitter 130 may include an impurity region 132, a gate insulating film 134, a gate electrode 136, and a spacer 138.

The impurity region 132 may prevent dark current generated regardless of an image that may be sensed when the charge transmitter 130 is turned off. The impurity region 132 may be formed near the surface of the upper substrate area 101b to prevent the dark current. For example, the impurity region 132 may be formed at a depth of about 2000 Å.

The gate insulating film 134 may be formed of $SiO_2$, SiON, SiN, $Al_2O_3$, $Si_3N_4$, $Ge_xO_yN_z$, $Ge_xSi_yO_z$, or a high dielectric material. The gate insulating film 134 may be formed of a high dielectric material, for example, $HfO_2$, $ZrO_2$, $Al_2O_3$, $Ta_2O_5$, hafnium silicate, zirconium silicate, or a combination thereof, by an atomic layer deposition method. In addition, the gate insulating film 134 may be formed in a laminated structure of a plurality of layers formed of at least two of the above-mentioned materials. The gate insulating film 134 may be formed with a thickness of about 5 to 100 Å.

The gate electrode 136 may be formed of a conductive polysilicon film, a metal film, for example, W, Pt, and Al film, a metal nitride, for example, TiN, a metal silicide film made of refractory metal, for example, Co, Ni, Ti, Hf, and Pt, or a combination thereof. In addition, the gate electrode 136 may be formed by sequentially laminating a conductive polysilicon film and a metal silicide film or by sequentially laminating a conductive polysilicon film and a metal film. However, the structure of the gate electrode 136 is not limited thereto.

The spacers 138 may be formed on each side of walls of the gate electrode 136, and may be formed of a nitride film.

Figure 5:
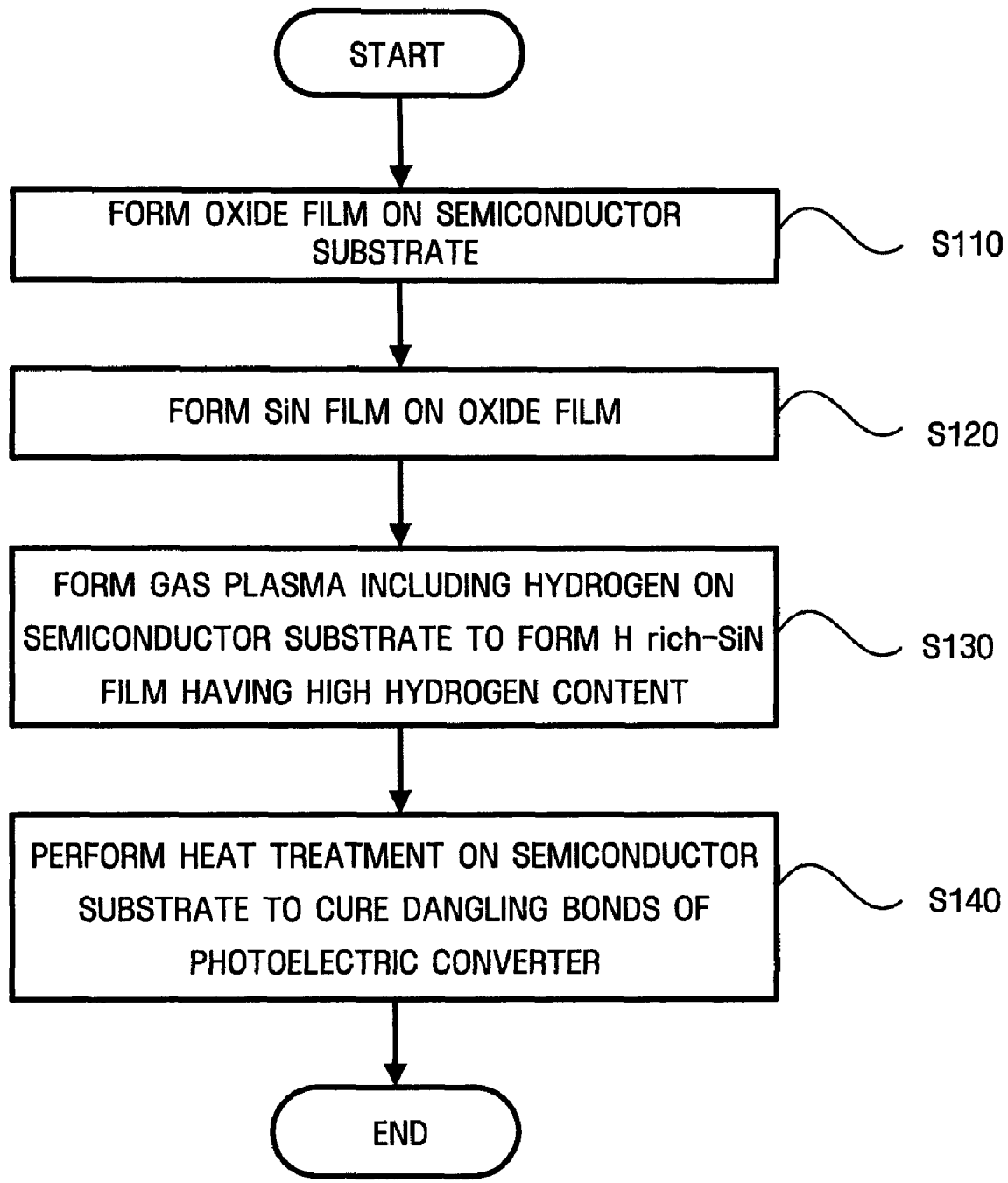
FIG. 5 is a flow chart illustrating a method of manufacturing an image sensor according to an example embodiment.

Next, a method of manufacturing an image sensor according to an example embodiment will be described with reference to FIGS. 5 to 9. FIG. 5 is a flow chart illustrating a method of manufacturing an image sensor according to an example embodiment. FIGS. 6 to 9 are cross-sectional views illustrating a method of manufacturing an image sensor according to an example embodiment.

Figure 6:
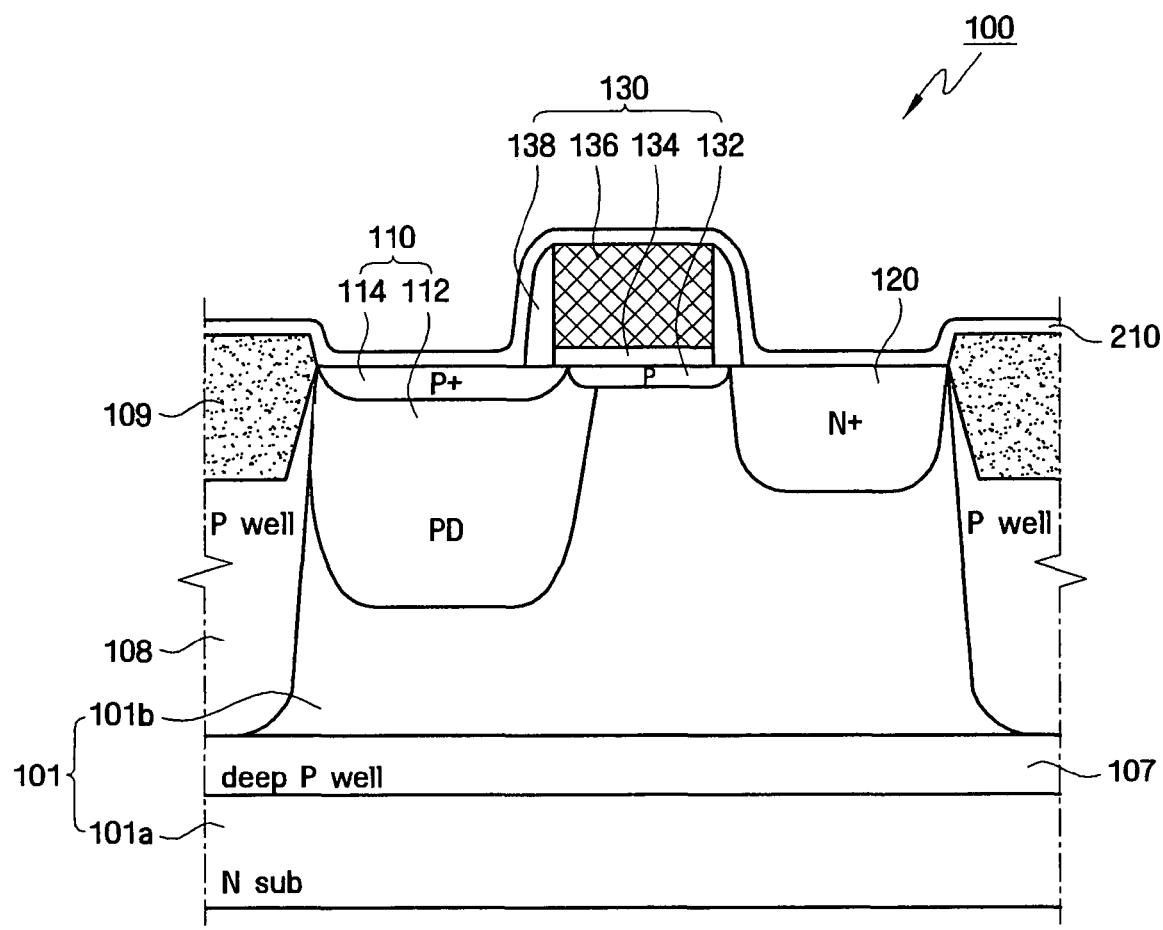
FIGS. 6 to 9 are cross-sectional views illustrating a method of manufacturing an image sensor according to an example embodiment.

First, referring to FIGS. 5 and 6, an oxide film 210 may be formed on a semiconductor substrate 101 (S110). In detail, the oxide film 210 may be conformally formed on the semiconductor substrate 101 having the photoelectric converter 110, the charge detector 120, the charge transmitter 130, a reset unit (see reference numeral 140 of FIG. 2), an amplifier (see reference numeral 150 of FIG. 2), and a selector (reference numeral 160 of FIG. 2) formed thereon. The oxide film 210 may be used as a buffer film in a subsequent process.

Figure 7:
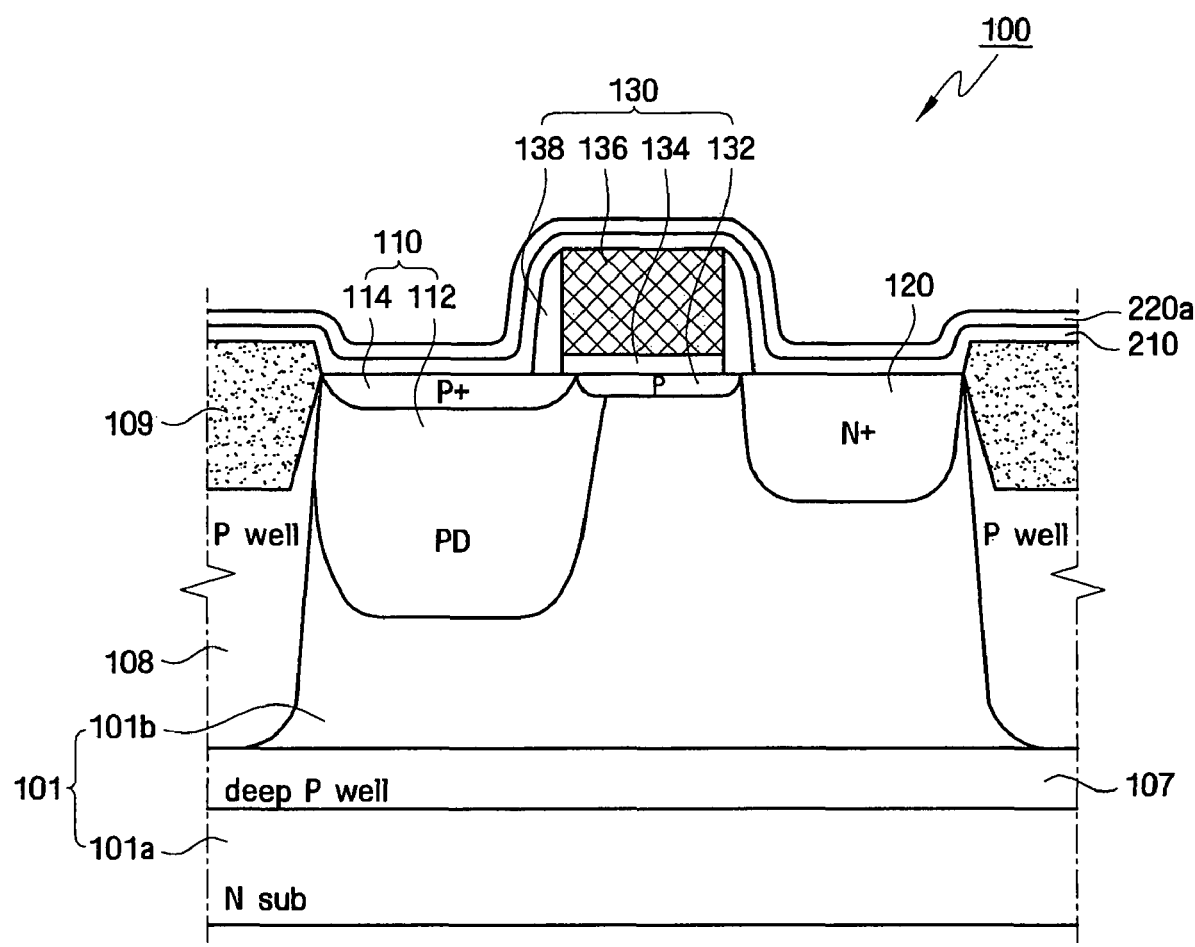

Referring to FIGS. 5 and 7, a silicon nitride (SiN) film 220a may be formed on the oxide film 210 (S120). In this example embodiment, the SiN film 220a may be formed by an LPCVD method. The thickness of the SiN film 220a may be in a range of about 50 to 400 Å.

The SiN film 220a may be formed to have a smaller thickness with the LPCVD method than by a PECVD method. That is, when the SiN film 220a requires a small thickness, the LPCVD method may be used to form the SiN film 220a.

When the SiN film 220a is a silicide blocking film, it may be difficult to decrease the thickness of the SiN film 220a. That is, when the SiN film 220a, which may be composed of the silicide blocking film, is used to prevent the diffusion of hydrogen, it may be difficult to decrease the thickness of the SiN film 220a. In this case, there may be an advantage to not provide an insulating film for preventing the diffusion of hydrogen. The SiN film 220a may be formed in a certain portion of the semiconductor substrate 101. That is, the semiconductor substrate 101 may be divided into a first area in which the silicide blocking film (SiN film 220a) may be formed thereon and a second area in which the silicide blocking film is not formed. An active pixel sensor array (reference numeral 10 of FIG. 1) may be formed in the first area, and the second area may be a logic area. When the SiN film 220a is the silicide blocking film, the LPCVD method may be used to form the SiN film 220a having a small thickness, for example, to a thickness of about 100 to 300 Å.

Figure 8:
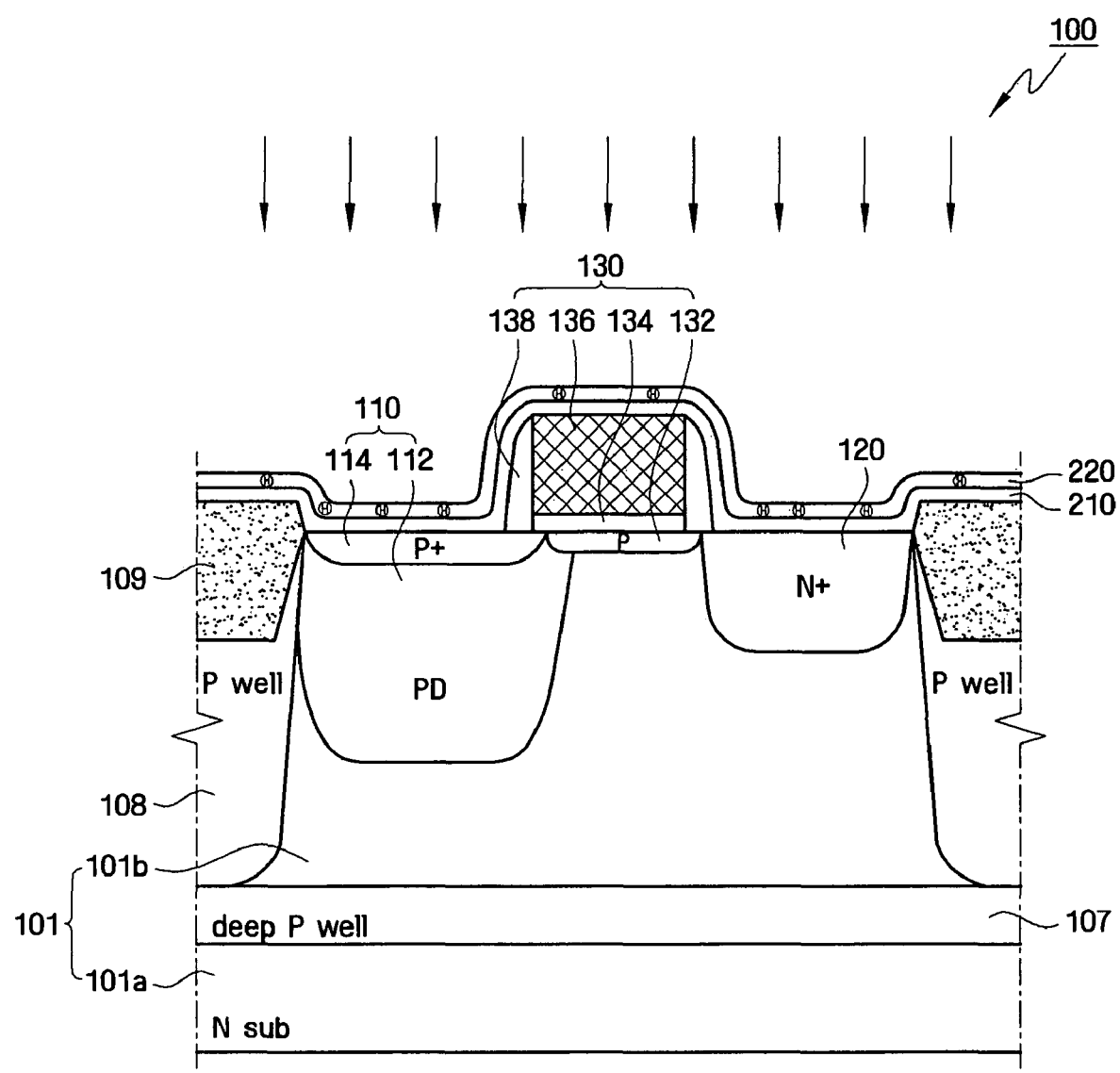

Referring to FIGS. 5 and 8, gas plasma including hydrogen may be used to supply high hydrogen content to the semiconductor substrate 101 (S130).

Gas including hydrogen may be supplied onto the semiconductor substrate 101. The gas including hydrogen may be, for example, $H_2$, $NH_3$, or a combination thereof. Subsequently, plasma power may be supplied to form gas plasma including hydrogen. Then, hydrogen may bond to the SiN film (reference numeral 220a of FIG. 7) to form an H rich-SiN film 220 having a high hydrogen content. When the gas plasma including hydrogen is formed on the semiconductor substrate 101, it may be possible to increase the content of hydrogen bonded to the SiN film 220a, as compared with gas not supplied with plasma. The plasma may weaken the Si—N bonding on the surface of the SiN film 220a, and facilitate the bonding of hydrogen to the SiN film 220a.

Figure 9:
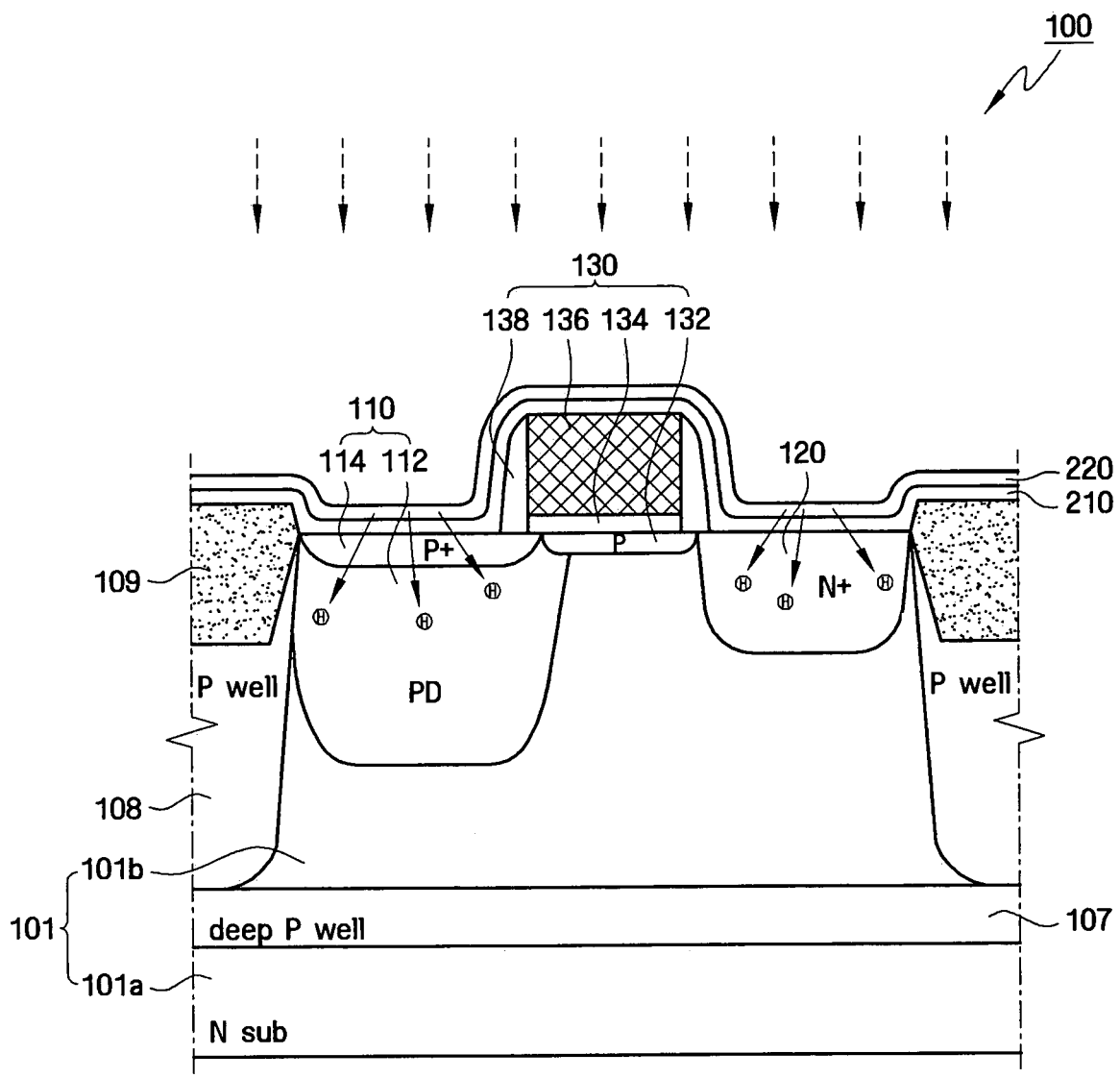

Referring to FIGS. 5 and 9, a heat treatment may be performed on the semiconductor substrate 101 to reduce dangling bonds on the photoelectric converter 110 (S140).

When the heat treatment is performed on the semiconductor substrate 101, hydrogen in the H rich-SiN film 220 may diffuse to the photoelectric converter 110. The hydrogen diffused to the photoelectric converter 110 may cure the dangling bonds. In this case, the heat treatment may be performed in a furnace by an annealing process or a rapid thermal processing (RTP) process. The heat treatment may be performed at a temperature of about 400 to 900° C.

When the H rich-SiN film 220 is a silicide blocking film, hydrogen may be diffused into the semiconductor substrate 101 in the entire area in which the silicide blocking film is formed. According to the method of manufacturing an image sensor in the example embodiment, after gas plasma including hydrogen is formed, a heat treatment may be performed on the semiconductor substrate 101 to effectively cure the dangling bonds. That is, hydrogen may be supplied to the semiconductor substrate 101 to form the H rich-SiN film 220 having a high hydrogen content. A heat treatment may be performed on the semiconductor substrate 101 to diffuse the hydrogen of the H rich-SiN film 220 to the photoelectric converter, thereby effectively curing the dangling bonds.

Further, the LPCVD method may be used to form the H rich film 220, which may reduce the thickness of the H rich film 220.

Therefore, it may be possible to form the H rich film 220 having a small thickness and to prevent dark current due to the dangling bonds and, as a result, improving the reliability of an image sensor.

Figure 10:
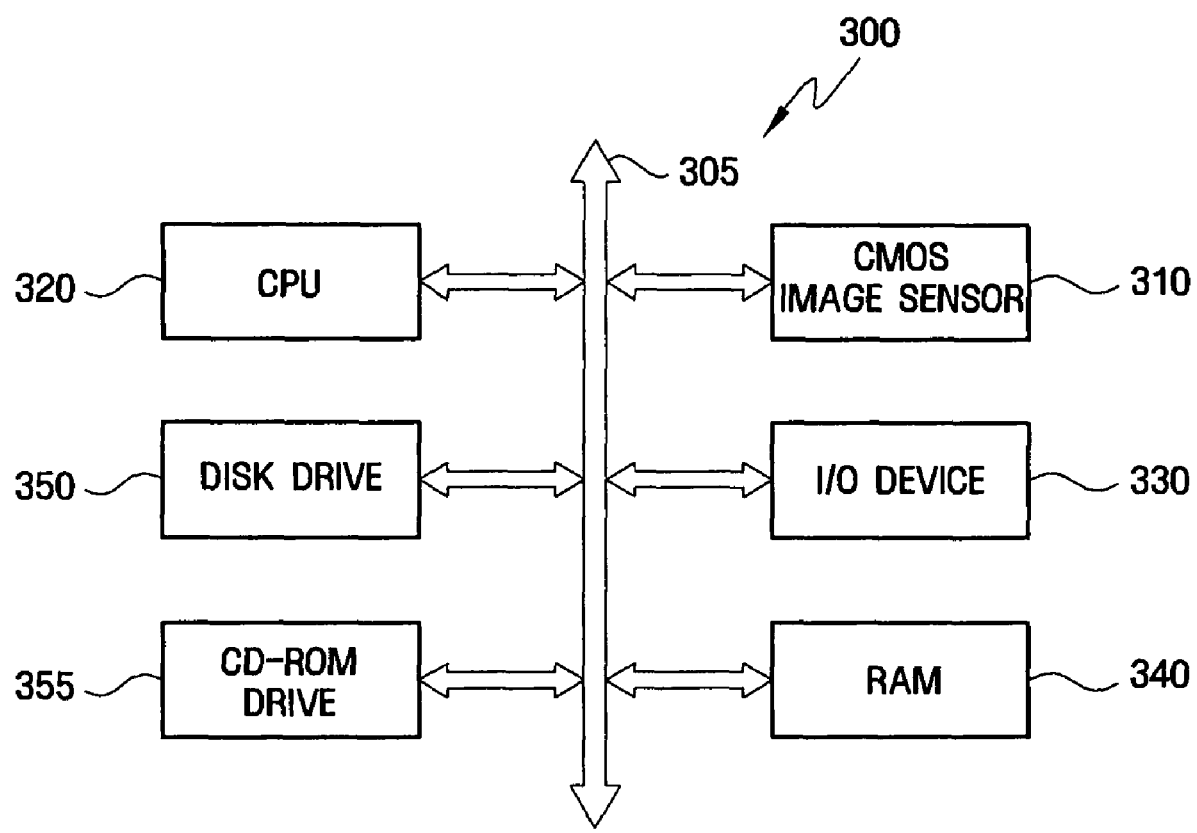
FIG. 10 is a diagram schematically illustrating a processor-based system including an image sensor according to an example embodiment.

FIG. 10 is a diagram schematically illustrating a processor-based system including an image sensor according to an example embodiment.

Referring to FIG. 10, a processor-based system 300 may be a system for processing an image output from a CMOS image sensor 310. Any of the following systems may be used as the system 300: a computer system, a camera system, a scanner, a mechanized clock system, a navigation system, a videophone, a supervisory system, an automatic focus system, a tracking system, an operation monitoring system, an image stabilizing system, etc.

The processor-based system 300, for example, a computer system, may include a central processing unit 320, for example a microprocessor, capable of communicating with an I/O device 330 through a bus 305. The CMOS image sensor 310 may communicate with the system through the bus 305 or another communication link. The processor-based system 300 may further include a RAM 340, a disk drive 350, for example, disk, a CD-ROM drive 355, and a port 360 that may communicate with the CPU 320 through the bus 305. The port 360 may be a port capable of coupling, for example, a video card, a sound card, a memory card, or a USB device to the processor-based system 300 or communicating with another system. The CMOS image sensor 310 may be integrated with a CPU, a digital signal processor (DSP), or a microprocessor. In addition, the CMOS image sensor 310 may be integrated with a memory, and the CMOS image sensor 310 may be integrated with a separate chip.

While example embodiments have been described above with reference to the accompanying drawings, it will be understood by those skilled in the art that various modifications and changes may be made without departing from the scope of the example embodiments.

What is claimed is:

1. A method of manufacturing an image sensor, the method comprising:
   forming a plurality of photoelectric converters on a semiconductor substrate;
   forming a silicon nitride (SiN) film on the plurality of photoelectric converters by low pressure chemical vapor deposition (LPCVD);
   supplying gas including hydrogen to the SiN film; and
   following said supplying gas step and prior to additional processing steps, performing a heat treatment on the semiconductor substrate to diffuse the hydrogen of the SiN film into the plurality of photoelectric converters.

2. The method of claim 1, wherein the SiN film is formed to a thickness of about 50 to 400 Å.

3. The method of claim 2, wherein the SiN film is formed to a thickness of about 100 to 300 Å.

4. The method of claim 1, wherein the gas including the hydrogen is $H_2$, $NH_3$, or a combination thereof.

5. The method of claim 1, further comprising:
   supplying power to the gas including the hydrogen to form a plasma.

6. The method of claim 1, wherein the heat treatment is an annealing process or a rapid thermal processing (RTP) process.

7. The method of claim 6, wherein the heat treatment is performed at a temperature of about 400 to 900° C.

8. The method of claim 1, wherein prior to forming the SiN film, the method further comprising:
   forming an oxide film over the semiconductor substrate.

9. The method of claim 1, wherein the SiN film is a silicide blocking film.

10. The method of claim 9, wherein the SiN film is formed with a thickness of about 50 to 400 Å.

11. The method of claim 10, wherein the SiN film is formed with a thickness of about 100 to 300 Å.

12. The method of claim 9, wherein the gas including the hydrogen is H2, NH3, or a combination thereof.

13. The method of claim 9, wherein the silicide blocking film is formed over only a portion of the semiconductor substrate.

14. The method of claim 13, further comprising:
   forming an active pixel sensor array in the portion.

15. The method of claim 14, wherein the forming the active sensor array step forms a plurality of unit pixels, each of the plurality of unit pixels configured to convert an optical image into electrical signals.

16. A method of manufacturing an image sensor, the method comprising:
   forming a plurality of photoelectric converters on a semiconductor substrate;
   forming a silicon nitride (SiN) film on the plurality of photoelectric converters by low pressure chemical vapor deposition (LPCVD);
   bonding hydrogen to the SiN film; and
   following the bonding step and prior to additional processing steps diffusing the hydrogen of the SiN film into the plurality of photoelectric converters.

17. The method of claim 16, wherein the diffusion step includes performing a heat treatment.

18. The method of claim 17, wherein the heat treatment is performed at a temperature of about 400 to 900° C.

19. The method of claim 16, wherein the SIN film is formed to a thickness of about 50 to 400 Å.

20. The method of claim 16, wherein the bonding step includes supplying a gas including the hydrogen.

21. The method of claim 20, wherein the bonding step includes supplying power to the gas including the hydrogen to form a plasma.

22. The method of claim 21, wherein the gas including the hydrogen is $H_2$, $NH_3$ or a combination thereof.

* * * * *